United States Patent
Blech et al.

(10) Patent No.: US 10,522,895 B2
(45) Date of Patent: Dec. 31, 2019

(54) MICROWAVE ANTENNA APPARATUS, PACKING AND MANUFACTURING METHOD

(71) Applicant: SONY CORPORATION, Tokyo (JP)

(72) Inventors: Marcel Blech, The Hague (NL); Ali Eray Topak, Stuttgart (DE); Arndt Thomas Ott, Bissingen an der Teck (DE)

(73) Assignee: SONY CORPORATION, Tokyo (JP)

(*) Notice: Subject to any disclaimer, the term of this patent is extended or adjusted under 35 U.S.C. 154(b) by 301 days.

(21) Appl. No.: 15/526,013

(22) PCT Filed: Dec. 11, 2015

(86) PCT No.: PCT/EP2015/079452
§ 371 (c)(1),
(2) Date: May 11, 2017

(87) PCT Pub. No.: WO2016/092084
PCT Pub. Date: Jun. 16, 2016

(65) Prior Publication Data
US 2017/0324135 A1    Nov. 9, 2017

(30) Foreign Application Priority Data
Dec. 12, 2014   (EP) ................................ 14197562

(51) Int. Cl.
*H01Q 13/02*   (2006.01)
*H01P 5/107*   (2006.01)
(Continued)

(52) U.S. Cl.
CPC .............. *H01P 5/107* (2013.01); *H01P 3/121* (2013.01); *H01Q 1/38* (2013.01); *H01Q 13/0283* (2013.01); *H01L 2223/6677* (2013.01)

(58) Field of Classification Search
CPC ...... H01Q 1/38; H01Q 13/02; H01Q 13/0283; H01Q 23/00; H01P 3/121; H01P 5/107
See application file for complete search history.

(56) References Cited

U.S. PATENT DOCUMENTS

2010/0225410 A1    9/2010   Margomenos et al.
2010/0328188 A1*  12/2010   Chang .................. H01Q 21/064
                                                             343/893
(Continued)

FOREIGN PATENT DOCUMENTS

JP    2006-304113 A    11/2006
WO   2013/161279 A1   10/2013

OTHER PUBLICATIONS

Steven Brebels, et al., "Compact LTCC Antenna Package for 60 GHz Wireless Transmission of Uncompressed Video," Microwave Symposium Digest (MTT), 2011 IEEE MTT-S International, Jun. 5-10, 2011, (4 pages), XP032006778.

(Continued)

*Primary Examiner* — Hoang V Nguyen
(74) *Attorney, Agent, or Firm* — Xsensus, LLP (57) ABSTRACT

A microwave antenna apparatus includes: a redistribution layer including a carrier layer, a ground plane arranged on a first or second surface of the carrier layer, and a microstrip line arranged on the other one of the first or second surface of the carrier layer; a semiconductor element mounted on the first surface of the carrier layer and coupled to the ground plane and the microstrip line; a mold layer that covers the semiconductor element and the first surface of the carrier layer; and a waveguide arranged within the mold layer and on the first surface of the carrier layer and coupled to the semiconductor element by the microstrip line, wherein a solid state filling material is arranged within the waveguide. Further, integrated antennas and transitions are presented within eWLB packages.

15 Claims, 9 Drawing Sheets

(51) Int. Cl.
H01P 3/12 (2006.01)
H01Q 1/38 (2006.01)

(56) References Cited

U.S. PATENT DOCUMENTS

| | | | |
|---|---|---|---|
| 2014/0035892 A1* | 2/2014 | Shenoy | G09G 3/3266 345/205 |
| 2014/0110841 A1* | 4/2014 | Beer | H01L 23/49822 257/738 |
| 2014/0176368 A1* | 6/2014 | Kamgaing | H01P 11/00 343/700 MS |
| 2014/0240062 A1 | 8/2014 | Herbsommer et al. | |
| 2014/0254979 A1 | 9/2014 | Zhang et al. | |
| 2014/0285277 A1* | 9/2014 | Herbsommer | H01P 3/16 333/1 |
| 2015/0109068 A1 | 4/2015 | Kawata | |

OTHER PUBLICATIONS

M. Wojnowski, et al., "Embedded Wafer Level Ball Grid Array (eWLB) Technology for Millimeter-Wave Applications," Proc. IEEE 2011 13th Electronics Packaging Technology Conference (EPTC2011), Dec. 2011, pp. 423-429.

Alexander Fischer, et al., "A 77-GHz Antenna in Package," Proc. 41st European Microwave Conference (EuMC2011), Oct. 10-13, 2011, pp. 1316-1319.

Mahmoud Al Henawy, et al., "Integrated Antennas in eWLB Packages for 77 GHz and 79 GHz Automotive Radar Sensors," Proc. 41st European Microwave Conference (EuMC2011), Oct. 10-13, 2011, pp. 1312-1315.

Abouzar Hamidipour, et al., "A Rhombic Antenna Array Solution in eWLB Package for Millimeter-Wave Applications," Proc. 42nd European Microwave Conference (EuMC2012), Oct. 29-Nov. 1, 2012, pp. 205-208.

Z. Tong, et al., "Wideband Differential Antenna in Package with Superstrate Structure at 77GHz," 2012 Proc. IEEE Asia-Pacific Conference on Antennas and Propagation (APCAP2012), Aug. 27-29, 2012, (4 pages).

M. Pourmousavi, et al., "Antenna Design and Characterization for a 61 GHz Transceiver in eWLB Package," Proc. 8th European Microwave Conference (EuMC2013), Oct. 6-8, 2013, pp. 444-447.

Abouzar Hamidipour, et al., "Antennas in Package With Stacked Metallization," Proc. 43rd European Microwave Conference (EuMC2013), Oct. 7-10, 2013, pp. 56-59.

Abouzar Hamidipour, et al., "160-GHz SiGe-Based Transmitter and Receiver With Highly Directional Antennas in Package," Proc. $8^{th}$ European Microwave Integrated Circuits Conference (EuMIC2013), Oct. 6-8, 2013, pp. 81-84.

Alexander Fischer, et al., "77-GHz Multi-Channel Radar Transceiver With Antenna in Package," IEEE Transactions on Antennas and Propagation, vol. 62, No. 3, Mar. 2014, pp. 1386-1394.

E. Seler, et al., "Chip-to-Rectangular Waveguide Transition Realized in embedded Wafer Level Ball Grid Array (eWLB) Package," Proc. 64th Electronic Components and Technology Conference (ECTC), May 2014, (4 pages).

Jürgen Hasch, et al, "77 GHz Radar Transceiver with Dual Integrated Antenna Elements," German Microwave Conference, 2010, pp. 280-283.

Liam Devlin, "The Future of MM-Wave Packaging," ARMMS conference, Apr. 2014, (11 pages).

Juan Pablo Guzman, Doctoral Thesis on "Co-design of integrated PA (Power Amplifier)—Antenna Modules on silicon Technologies for the optimization of power efficiency," Telecom Bretagne, Version 1, Feb. 26, 2013, (233 pages).

E. Seler, et al., "3D rectangular waveguide integrated in embedded Wafer Level Ball Grid Array (eWLB) package," 2014 IEEE 64th Electronic Components and Technology Conference (ECTC), May 27-30, 2014 (Abstract), (2 pages).

International Search Report dated Mar. 8, 2016 in PCT/EP2015/079452 filed Dec. 11, 2015.

* cited by examiner

MICROWAVE ANTENNA APPARATUS, PACKING AND MANUFACTURING METHOD

CROSS-REFERENCE TO RELATED APPLICATIONS

The present application is based on PCT filing PCT/EP2015/079452 filed Dec. 11, 2015, and claims priority to European Patent Application 14 197 562.3 filed in the European Patent Office on Dec. 12, 2014, the entire contents of each of which being incorporated herein by reference.

BACKGROUND

Field of the Disclosure

The present disclosure relates to a microwave antenna apparatus, a microwave antenna package and a method of manufacturing a microwave antenna apparatus.

Description of Related Art

Fan-out wafer level packaging technology such as the embedded wafer-level ball grid array (eWLB) has matured for mm-wave radar and communication systems over the past years. This packaging technology is the first choice for low-cost system integration of MMICs, passives, and antennas into a single plastic package. Many different types of planar antenna structures have been published, e.g. in M. Wojnowski et al., "Embedded Wafer Level Ball Grid Array (eWLB) Technology for Millimeter-Wave Applications," Proc. IEEE 13th Electronics Packaging Technology Conference (EPTC2011), Singapore, Singapore, pp. 423-429, December 2011. They all have in common, that the antenna elements are printed on one or more redistribution layers (RDLs). The disadvantage of the aforementioned solutions are their narrow bandwidth (1-5%), distorted radiation patterns, and the high amount of parasitic radiation to all directions. Further, E. Seler et al., "Chip-to-Rectangular Waveguide Transition Realized in embedded Wafer Level Ball Grid Array (eWLB) Package," Proc. 64th Electronic Components and Technology Conference (ECTC), Orlando, Fla., USA, May 2014 suggests using printed waveguide structures integrated to the eWLB package for guided transmission. However, the mechanical interface is relatively complicated and thus not applicable for a series product.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a microwave antenna apparatus and a microwave antenna package having a larger bandwidth, improved radiation patterns, a reduced amount of parasitic radiation to all directions and which is applicable as series product. Further, a corresponding method of manufacturing a microwave antenna apparatus shall be provided.

According to an aspect there is provided a microwave antenna apparatus comprising
a redistribution layer comprising a carrier layer, a ground plane arranged on a first or second surface of the carrier layer and a microstrip line arranged on the other one of the first or second surface of the carrier layer,
a semiconductor element mounted on the first surface of the carrier layer and coupled to the ground plane and the microstrip line,
a mold layer covering the semiconductor element and the first surface of the carrier layer, and
a waveguide arranged within the mold layer and on the first surface of the carrier layer and coupled to the semiconductor element by the microstrip line, wherein a solid state filling material is arranged within the waveguide.

According to another aspect there is provided a microwave antenna package comprising
a redistribution layer comprising a carrier layer, a microstrip line arranged on a first surface of the carrier layer and a ground plane arranged on second surface of the carrier layer opposite the first surface,
a semiconductor element mounted on the first surface of the carrier layer and coupled to the ground plane and the microstrip line,
a mold layer covering the semiconductor element and the first surface of the carrier layer, and
a resonator unit arranged within the mold layer and on the first surface of the carrier layer, wherein the resonator unit comprises a substrate element, in particular made of quartz glass, PTFE, LCP or ceramic, coupled to the microstrip line and a resonator element mounted on a surface of the substrate element facing away from the first surface of the carrier layer.

According to a further aspect there is provided a microwave antenna package comprising
a PCB arrangement comprising a PCB layer and
a microwave antenna apparatus as described above coupled to the PCB arrangement forming an embedded wafer-level ball grid array.

According to a further aspect there is provided a microwave antenna package comprising
a PCB arrangement comprising a PCB layer carrying a first contact layer on a first surface and a second contact layer on a second surface opposite the first surface, wherein said contact layers are coupled by coupling elements arranged within the PCB layer, wherein a transmission area of the PCB layer is arranged between coupling elements and is free from the contact layer, and
a microwave antenna apparatus coupled to the PCB arrangement forming an embedded wafer-level ball grid array, said microwave antenna element comprising
a redistribution layer comprising a carrier layer, a ground plane arranged on a first or second surface of the carrier layer and a microstrip line arranged on the other one of the first or second surface of the carrier layer,
a semiconductor element mounted on the first surface of the carrier layer and coupled to the ground plane and the microstrip line,
a mold layer covering the semiconductor element and the first surface of the carrier layer.

According to a further aspect there is provided a microwave antenna package comprising
a PCB arrangement comprising a PCB layer carrying a microstrip line on a first surface and a ground plane on a second surface opposite the first surface,
a microwave antenna apparatus coupled to the PCB arrangement forming an embedded wafer-level ball grid array, said microwave antenna element comprising
a mold layer carrying a metal layer arranged on a first surface facing the first surface of the PCB arrangement, a semiconductor element mounted on the metal layer, and
a waveguide arranged within the mold layer and on the metal layer and coupled to the semiconductor element by the metal layer, wherein a solid state filling material is arranged within the waveguide.

According to a further aspect there is provided a method of manufacturing a microwave antenna package comprising
mounting a semiconductor element (such as a bare-die IC) on a dummy carrier,
arranging (i.e. forming or placing) a waveguide on the dummy carrier, wherein the waveguide is open on a side opposite to the side on which it is arranged on the dummy carrier, wherein a solid state filling material is arranged within the inner volume of the waveguide and beyond the opening on the open side of the waveguide,
covering the semiconductor element, the waveguide including the solid state filling material and the dummy carrier layer by a mold layer,
thinning the mold layer to an extent that the mold layer is thicker than the height of the waveguide,
replacing the dummy carrier by a redistribution layer, e.g. using thin-film technology, comprising a carrier layer, a ground plane arranged on a first or second surface of the carrier layer and a microstrip line arranged on the other one of the first or second surface of the carrier layer.

Preferred embodiments are defined in the dependent claims. It shall be understood that the disclosed microwave antenna apparatus, the disclosed microwave antenna packages and the disclosed method of manufacturing may all have similar and/or identical preferred embodiments as disclosed herein and as defined in the dependent claims.

According to the present disclosure antenna functionality is integrated into an eWLB package, which may be achieved in different ways as disclosed herein. In particular, a small (preferably rectangular) waveguide section may be formed as a separate element mounted on top of the redistribution layer of the microwave antenna apparatus. In another embodiment the waveguide is formed as a transmission area within a PCB arrangement of the microwave antenna package. In still another embodiment a resonator unit comprising a substrate element and a resonator element are provided.

Another aspect of the disclosure is to protect the inside of the waveguide, from a mold mass covering the microwave antenna apparatus by use of an air-like solid state filling medium that is filled inside. For example, a foam of polyethylene or polyurethane can be used. The waveguide itself may e.g. be made of metal or of a polymer, which is coated by metal.

It shall be understood that according to the present disclosure the antenna may be used generally in the frequency range of millimeter waves and microwaves, i.e. in at least a frequency range from 3 GHz to 3 THz, in particular above 30 GHz. The "operating frequency" may generally be any frequency within this frequency range. When using the term "microwave" and/or "mm-wave" herein any electromagnetic radiation within this frequency range shall be understood.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
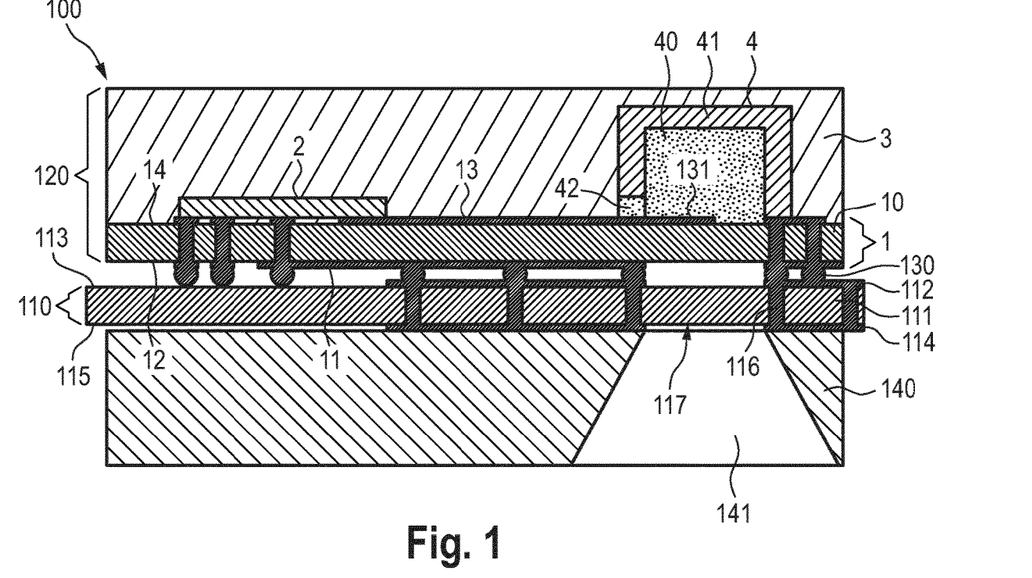
FIG. 1 shows a cross-sectional view of a first embodiment of a microwave antenna package according to the present disclosure.

Referring now to the drawings, wherein like reference numerals designate identical or corresponding parts throughout the several views, FIG. 1 shows a cross-sectional view of a first embodiment of a microwave antenna package 100 according to the present disclosure including a PCB (printed circuit board) arrangement 110 and a first embodiment of a microwave antenna apparatus 120 according to the present disclosure coupled to the PCB arrangement 110. The microwave antenna apparatus 120 forms an embedded wafer-level ball grid array (eWLB) and comprises a redistribution layer (RDL) 1 comprising a carrier layer 10, a ground plane 11 arranged on a second surface 12 of the carrier layer 10 and a microstrip line 13 arranged on the first surface 14 of the carrier layer 10. The microwave antenna apparatus 120 further comprises a semiconductor element 2, e.g. an MMIC (monolithic microwave integrated circuit) or other suitable integrated circuit, mounted on the first surface 14 of the carrier layer 10 and coupled to the ground plane 11 and the microstrip line 13. A mold layer 3 covers the semiconductor element 2 and the first surface 14 of the carrier layer 10. A waveguide 4 is arranged within the mold layer 3 and on the first surface 14 of the carrier layer 10 and is coupled to the semiconductor element 2 by the microstrip line 13, wherein a solid state filling material 40 is arranged within the waveguide 4.

Thus, in order to integrate antenna functionality into the microwave antenna package, a small rectangular waveguide section forming the waveguide 4 is employed. The waveguide has a backshort 41 spaced a wavelength from the feeding probe 131 formed by the front end of the microstrip line 13 which leads into the waveguide 4. The microstrip line 13 is, in an exemplary embodiment, made up of a copper microstrip line of thickness 8 µm as part of the redistribution layer on a thin sheet of e.g. polyimide with 10 µm thickness representing the carrier layer. For protecting the inside of the wave-guide 4 from the mold mass an air-like medium, representing the filling material 40, is filled inside. For example, foam of polyethylene or polyurethane, can be used as filling material 40. Generally, any material having a low permittivity, in particular a permittivity below 1.5 can be used, and useful materials are generally one or more of PCB material, mold material of the mold layer, material of the carrier, PTFE, PEN, PET, acryl.

The waveguide 4 may e.g. be made of metal or a polymer, which is coated by metal, and has a small opening 42 for the microstrip line 13, which opening 42 is also filled with filling material 40. During manufacture the waveguide 4 may be supplied with this filling material 40 and may be attached to the redistribution layer 1 by a pick-and-place machine as for other passive surface mounted devices such as resistors or capacitors.

A PCB arrangement 110 is coupled to the microwave antenna apparatus 120 by solder balls 130. The PCB arrangement 110 comprises a PCB layer 111 carries a first contact layer 112 on a first surface 113 and a second contact layer 114 on a second surface 115. The first contact layer 112 is coupled to the semiconductor element 2 via the coupling, i.e. the solder balls 130, between the PCB arrangement 110 and the microwave antenna apparatus 120. The first contact layer 112 and the second contact layer 114 are coupled by vias 116 through the PCB layer 111. A transmission area 117 of the PCB layer 111 facing the waveguide 4 is free from the contact layers 112, 114.

Thus, in this embodiment radiation takes place to the bottom side of the microwave antenna apparatus 120, to which the PCB arrangement 110 is soldered to as illustrated by the solder balls 130. Therefore, the transmission area 117, which—together with the vias 116—also represents a kind of waveguide structure, is provided in the PCB arrangement 110. In this embodiment an optional metal plate or a metallized plastic antenna frontend 140 (also called cover layer herein) is attached to the second surface 115 of the PCB layer 111. It can have an arbitrarily shaped horn aperture 141. It can also be replaceable in the field if the antenna pattern should be changed after deployment.

Figure 2:
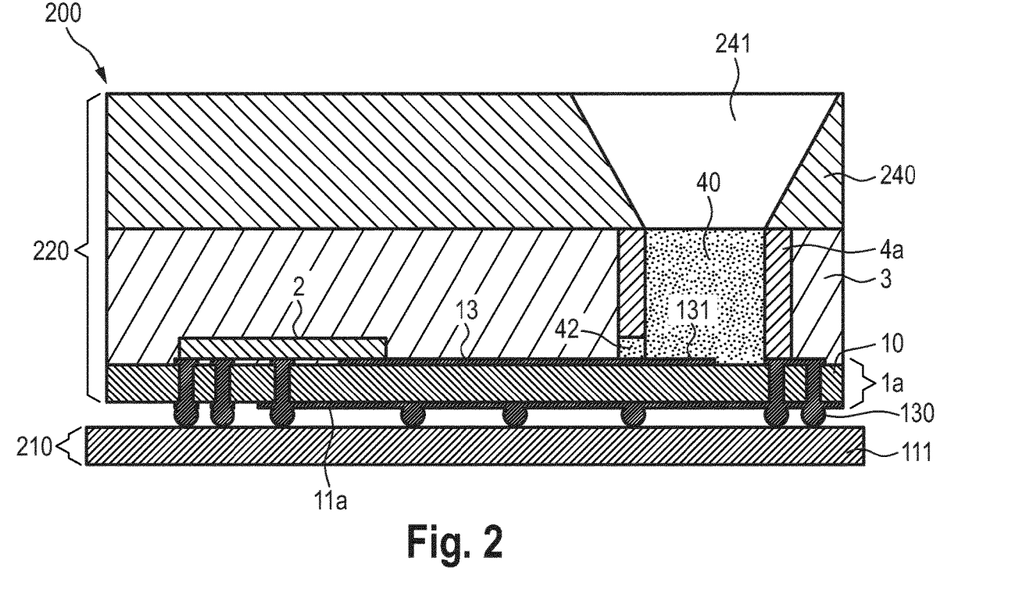
FIG. 2 shows a cross-sectional view of a second embodiment of a microwave antenna package according to the present disclosure.

Radiation through the PCB arrangement 110 is normally not so advantageous due to high losses and mismatch caused by misalignment of the microwave antenna apparatus 120. Thus, in a second embodiment of the microwave antenna apparatus 220 and the microwave antenna package 200 as shown in FIG. 2 radiation is emitted to the top side of the microwave antenna apparatus 220. In this embodiment a waveguide 4a, which is open at both ends and which has no backshort, is used. The waveguide 4a is also filled with a foam-like filling material 40. A hole 42 either in the broad side or the small side of the waveguide 4a provides access for the feed line (i.e. the microstrip line 13) of a patch antenna.

In this embodiment the redistribution layer 1a comprises a ground plane 11a which is not open underneath the waveguide 4a but is closed there. Further, an antenna frontend 240 (cover layer) comprising a horn antenna 241 is provided on top of the mold layer 3. Further, the PCB arrangement 210 merely comprises a PCB layer 111, but does not need any contact layers. This embodiment is thus slightly easier to manufacture, has less losses (because of a lower number of transitions) and is useful for use as a narrowband antenna.

Figure 3:
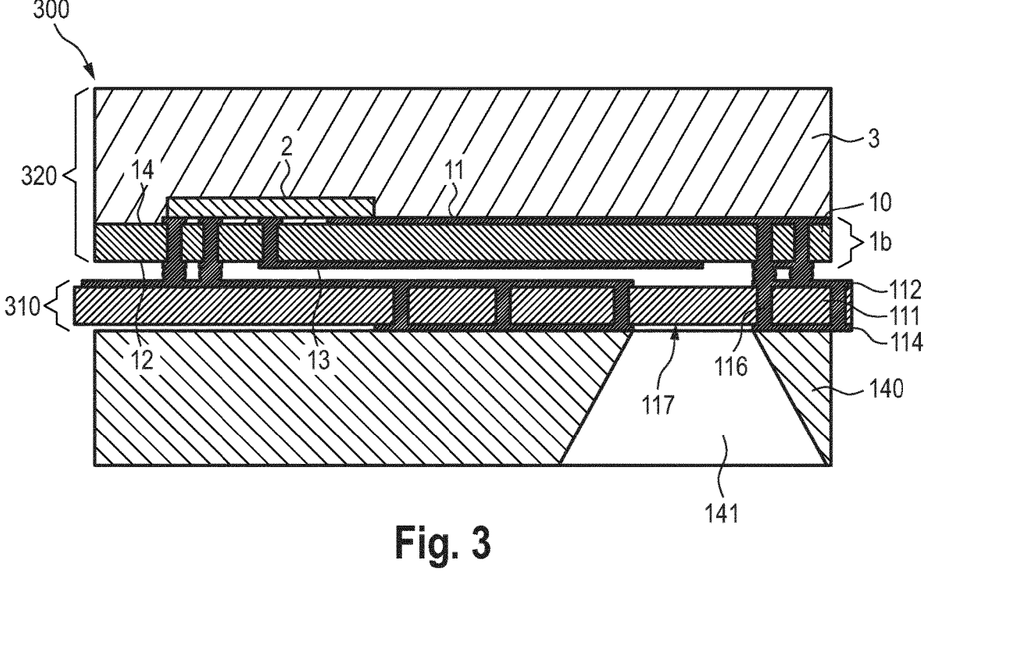
FIG. 3 shows a cross-sectional view of a third embodiment of a microwave antenna package according to the present disclosure.

FIG. 3 shows a cross-sectional view of a third embodiment of a microwave antenna package 300 including a third embodiment of a microwave antenna apparatus 320 according to the present disclosure and a PCB arrangement 310, which is substantially identical to the PCB arrangement 110 of the first embodiment. In this embodiment the radiation is emitted to the bottom side, which has the advantage that parasitic radiation emission from the semiconductor element 2 to the top side can be disregarded.

With the redistribution layer 1b of this embodiment of the microwave antenna apparatus 320 the ground plane 11 is provided on the first surface 14 of the carrier layer 10 and the microstrip line 13 is provided on the second surface 12. Further, no explicit waveguide as in the first embodiment is provided in the microwave antenna apparatus 320, but the radiation is emitted to the bottom side through the transmission area 117 acting as a rectangular waveguide.

Figure 4:
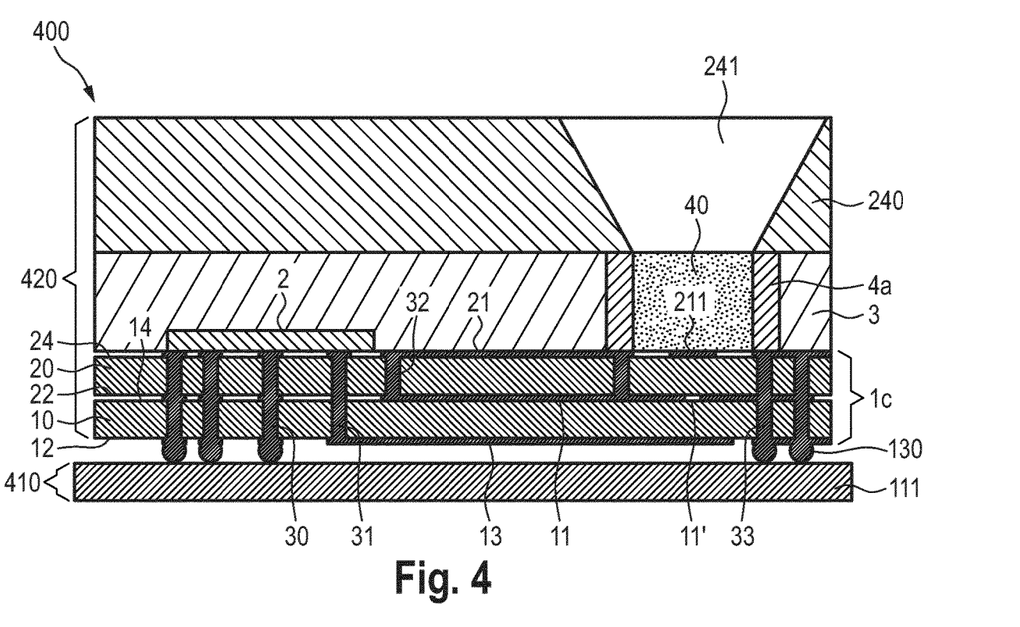
FIG. 4 shows a cross-sectional view of a fourth embodiment of a microwave antenna package according to the present disclosure.

FIG. 4 shows a cross-sectional view of a fourth embodiment of a microwave antenna package 400 including a fourth embodiment of a microwave antenna apparatus 420 according to the present disclosure and a PCB arrangement 410, which is substantially identical to the second embodiment of the PCB arrangement 210 shown in FIG. 2. This embodiment uses an aperture coupled patch topology. In this embodiment the redistribution layer 1c comprises two (or, generally, even more than two) carrier layers 10, 20. The microstrip line 13 is arranged on a second outer surface 12 of the redistribution layer 1c, i.e. on the bottom surface 12 of the first carrier layer 10, opposite the first outer surface 24, i.e. the top surface of the second carrier layer 20, on which the waveguide 4a is arranged. A metal layer 21 is arranged on the first outer surface 24 of the redistribution layer 1c. The ground plane 11 is arranged between the first and second carrier layer 10, 20, i.e. on the top surface 14 of the first carrier layer 10 and the bottom surface 22 of the second carrier layer 20 and also serves for partly shielding radiation emitted to the top side from the microstrip line.

The ground plane 11, the microstrip line 13 and the one (or, generally, more than one) metal layer(s) 21 (representing another ground plane(s)) are configured to form an aperture coupled patch feed adjacent to the waveguide 4a, wherein the radiation is emitted to the top side. For this purpose a patch element 211 of the metal layer 21 leads into the waveguide 4a, the ground plane 11 has a slot 11' underneath this patch element 211 and the microstrip line 13 leads to an area underneath the slot 111. The waveguide 4a does not require an opening at the side as in other embodiments, because the signal couples from the microstrip line 13 through the slot 11' to the patch 221 and the waveguide 4a without a galvanic connection. Vias 30, 31, 32, 33 are provided in the redistribution layer 1c to connect the semiconductor element 2 with the solder balls 130 and the microstrip line 13, respectively, and to connect the metal layer 21 with the ground plane 11 and the solder balls 130, respectively, as appropriate. The microstrip line 13 is encased by vias along its sides to shield any parasitic radiation. The vias 33 extend up to the rectangular waveguide 4a through the redistribution layers 10 and 12. Using more than two layers of metal (i.e. the ground plane 11, the microstrip line 13 and the metal layer 21) enables the usage of aperture coupled patch topologies, which generally tend to be more wideband.

Figure 5:
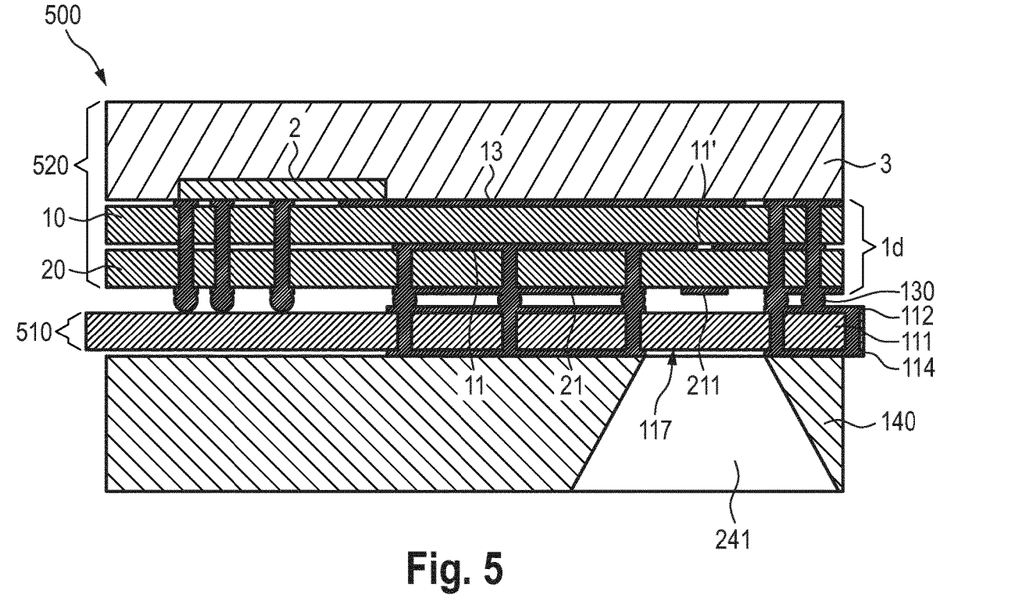
FIG. 5 shows a cross-sectional view of a fifth embodiment of a microwave antenna package according to the present disclosure.

FIG. 5 shows a cross-sectional view of a fifth embodiment of a microwave antenna package 500 including a fifth embodiment of a microwave antenna apparatus 520 according to the present disclosure and a PCB arrangement 510, which is substantially identical to the first embodiment of the PCB arrangement 110 shown in FIG. 1. This embodiment corresponds to a large extent to the fourth embodiment shown in FIG. 4 and also uses an aperture coupled patch feed, but radiation is emitted to the bottom side rather than to the top side. No waveguide is provided in the mold layer 3 as in the fourth embodiment, but the transmission area 117 in the PCB arrangement 510 is used as a rectangular waveguide for emission to the (optional) horn antenna 241. The redistribution layer 1d also comprises two carrier layers 10, 20, but the sequence of the microstrip line 13, the ground plane 11 and the metal layer 21 is reversed from top to bottom compared redistribution layer 1c of the fourth embodiment.

Figure 6A:
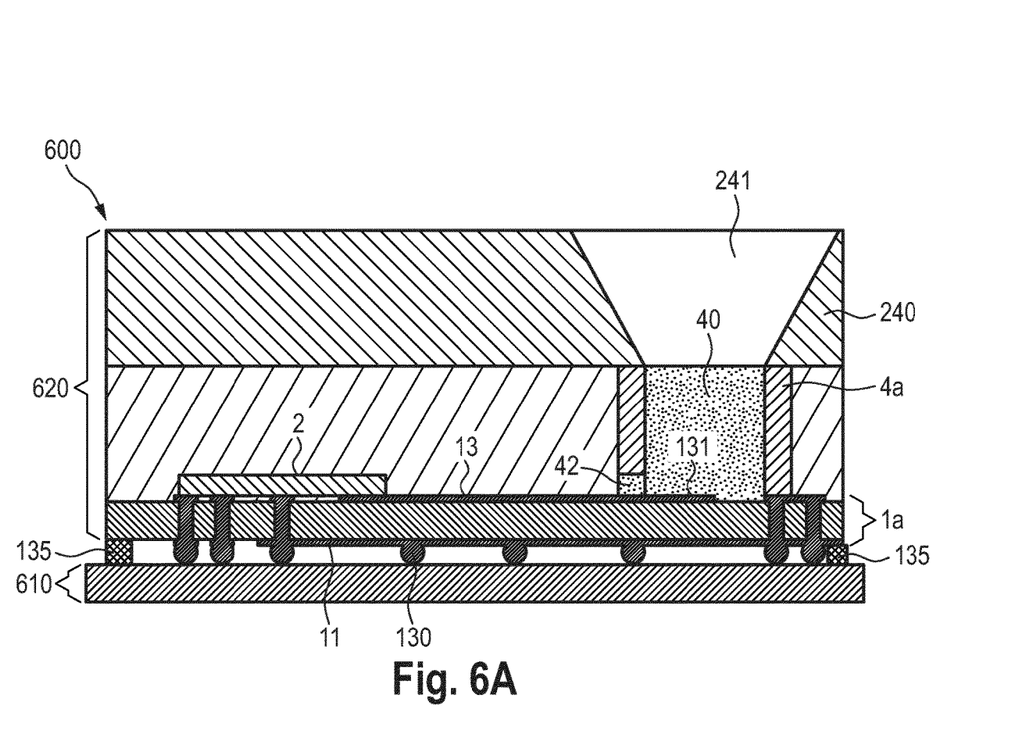
FIG. 6 shows a cross-sectional view of a sixth embodiment of a microwave antenna package according to the present disclosure using spacers and a bottom view of a layout of solder balls and spacers.
Figure 6B:
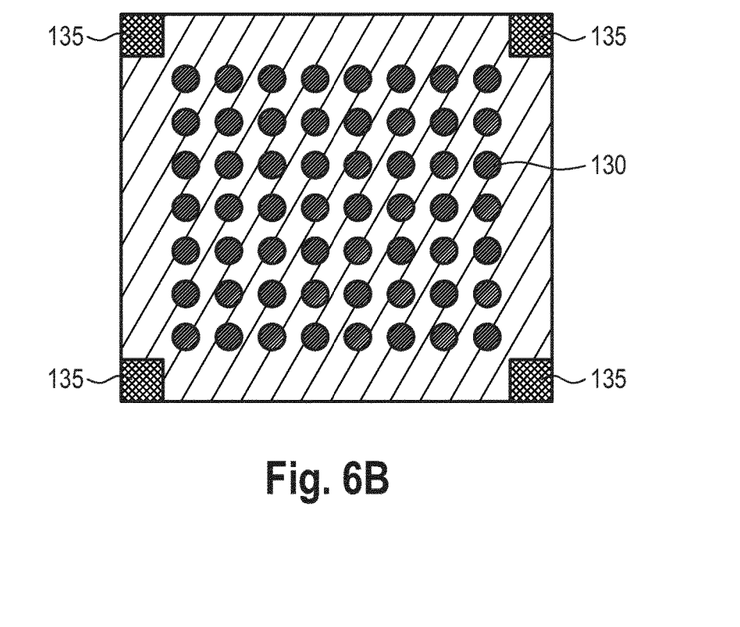

FIG. 6 shows a cross-sectional view (FIG. 6A) of a sixth embodiment of a microwave antenna package 600 according to the present disclosure using spacers and a bottom view (FIG. 6B) of a layout of solder balls and spacers used in the microwave antenna package 600. This embodiment is substantially identical to the second embodiment shown in FIG. 2, but between the PCB arrangement 610 and the microwave antenna apparatus 620 not only solder balls 130, but also spacers 135 are provided. These spacers 135 can ensure a well-defined distance between the top layer of the PCB arrangement 610 and bottom layer of the microwave antenna apparatus 620. The spacers 135 may be mounted to the bottom of the microwave antenna apparatus 620 or the top of the PCB arrangement 610 before coupling them by soldering. Alternatively, the spacers may be the same component as the mold mass 4, if they are molded as a single part. As shown in FIG. 6B four spacers 135 may be provided at the corners at the bottom of the microwave antenna apparatus 620, but in other embodiments more or less spacers may be provided (e.g. a closed ring around the outer edge or a plurality of spacers distributed around the edge may be provided). Further, the spacers 135 may also be provided at different positions e.g. somewhere between the solder balls 130.

Figure 7:
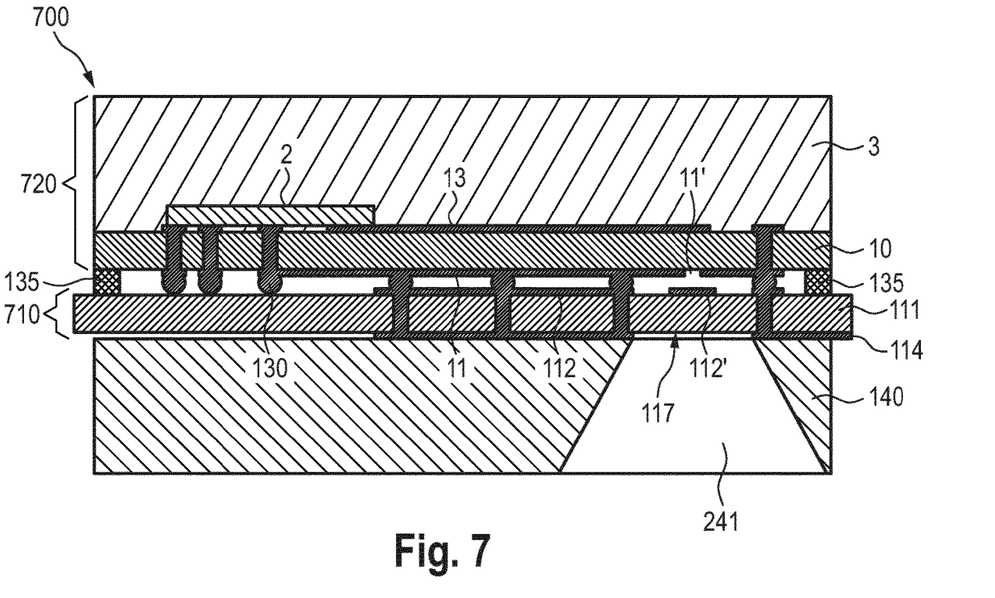
FIG. 7 shows a cross-sectional view of a seventh embodiment of a microwave antenna package according to the present disclosure.

The spacers 135 enable a very elegant and cost efficient antenna topology. FIG. 7 shows a cross-sectional view of a seventh embodiment of a microwave antenna package 700 according to the present disclosure including a seventh embodiment of a microwave antenna apparatus 720 according to the present disclosure and a PCB arrangement 710. In this embodiment a redistribution layer 1d with two metal layers is sufficient in order to use the wideband aperture coupled patch feeding, radiating to the bottom side in this embodiment. Only the microstrip line 13 and the slot 11' of the ground plane 11 are realized on the redistribution layer 1d, whereas the patch 112' is realized on the top copper layer 112 of the PCB arrangement 720. The spacers 135 ensure the desired spacing between the slot 11' and the patch 112'. Using air as medium with a well-defined thickness between the slot 11' and the patch 112' is beneficial for the overall loss and the bandwidth of the antenna.

Figure 8:
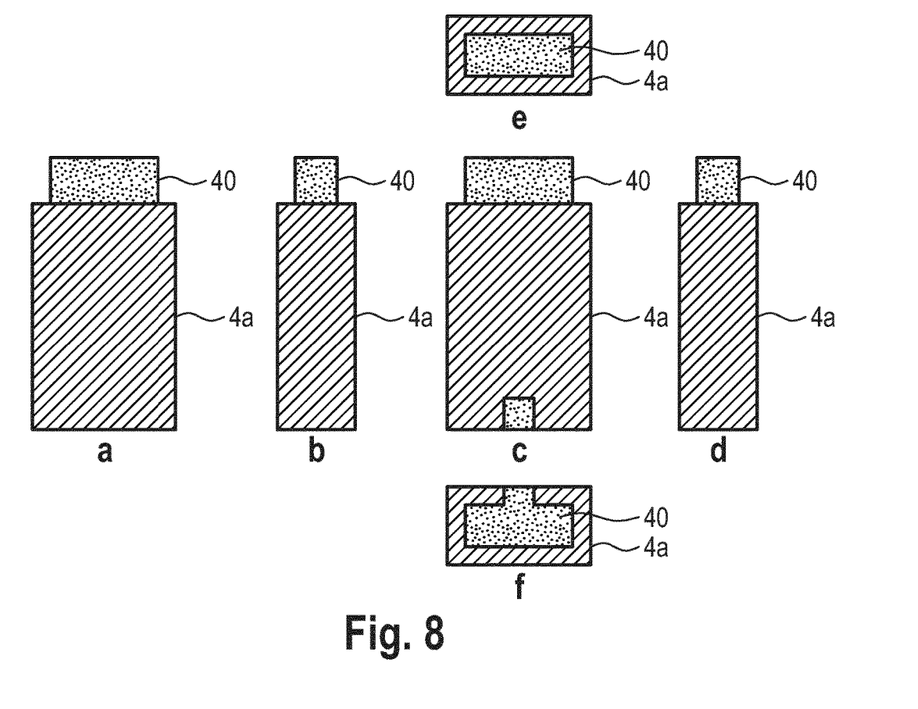
FIG. 8 shows different views of a waveguide according to the present disclosure.

FIG. 8 shows different views of a waveguide 4a according to the present disclosure as e.g. used in the second, fourth and sixth embodiments, including four side views a, b, c, d, top view e and bottom view f. The waveguide 4a may e.g. consist of metal walls or of metallized polymer. The foam-like filling material 40 is placed inside the waveguide 4a, which may have a similar permittivity as air. In an embodiment the filling material 40 is protruding on the top side of the waveguide 4a.

In an embodiment the filling material 40 may have a certain color coding along the length. This color coding can be used to indicate the height of the protrusion. For instance, as illustrated in the eighth embodiment of the microwave antenna package 800 (including a microwave antenna apparatus 820 and a PCB arrangement 810) shown in FIG. 9, the filling material 40 may have a color so that it can be optically distinguished from the mold material of the mold layer 3.

Figure 9A:
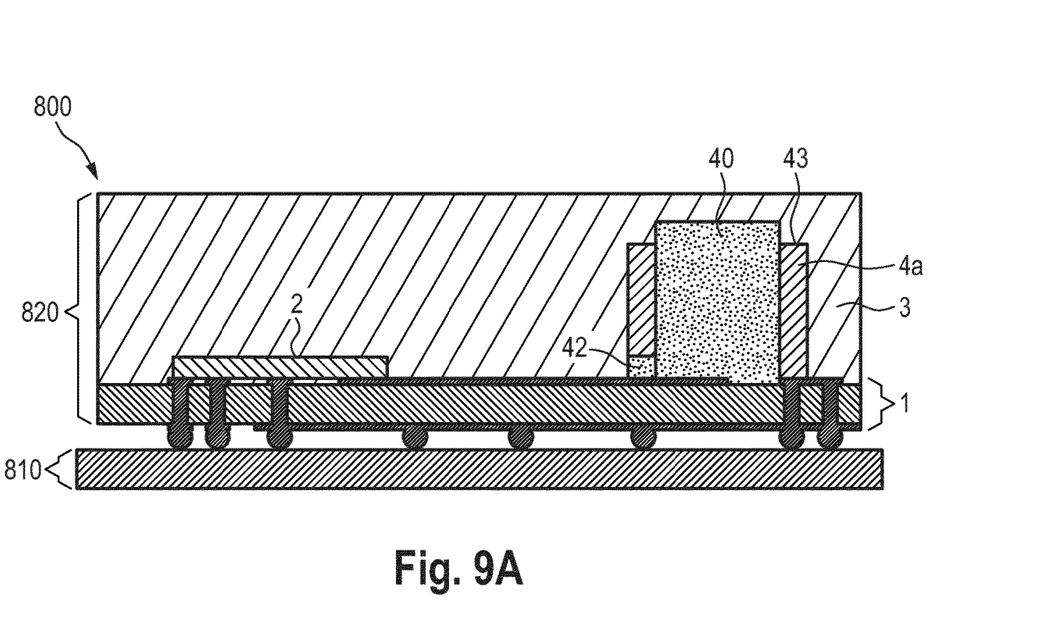
FIG. 9 shows a cross-sectional view of an eighth embodiment of a microwave antenna package according to the present disclosure during and after manufacturing.
Figure 9B:
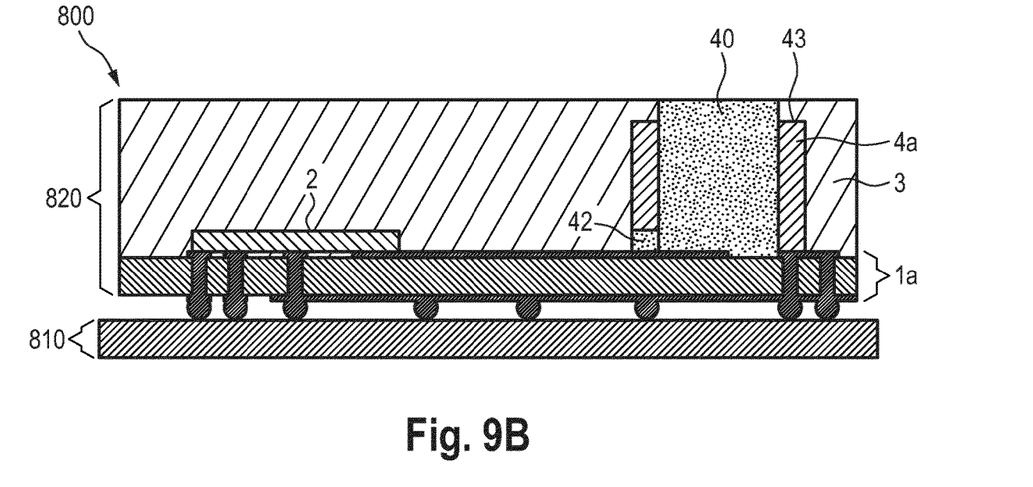

FIG. 9 shows how such a waveguide 4a can be integrated into the eWLB package 820. The processing step, when the redistribution layer 1 including the semiconductor element 2 and the waveguide 4a is molded is shown in FIG. 9A. The mold mass of the mold layer 3 is much thicker than the maximum height of the waveguide 4a and the filling material 40. In the next processing step as outlined in FIG. 9B the mold mass is thinned by grinding. The grinding machine must not touch the metal (i.e. the upper edge 43) of the waveguide 4a. Therefore it is proceeding until the color code of the filling material 40 is reached. This may e.g. be approx. 50-100 μm before the grinding tool would touch the upper edge 43 of the metal waveguide 4a.

In another embodiment the most protruding part of the filling material may have a first color up to a certain distance from the top of the waveguide 4a or even up to the upper edge 43 of the waveguide. The remaining part of the filling material 40, including at least all the filling material inside the waveguide 4a, then has a second color. The grinding of the mold material is then proceeded until the second color of the filling material is detected. Hence, the border between the first color and the second color is used to control how far (from the top) the grinding is performed.

It should be clear that instead of a color code any other code that can be used to distinguish mold material from filling material and that can be detected during grinding may be used for this purpose, such as the granularity of the air inclusions (bubbles) of the filling material.

Figure 10:
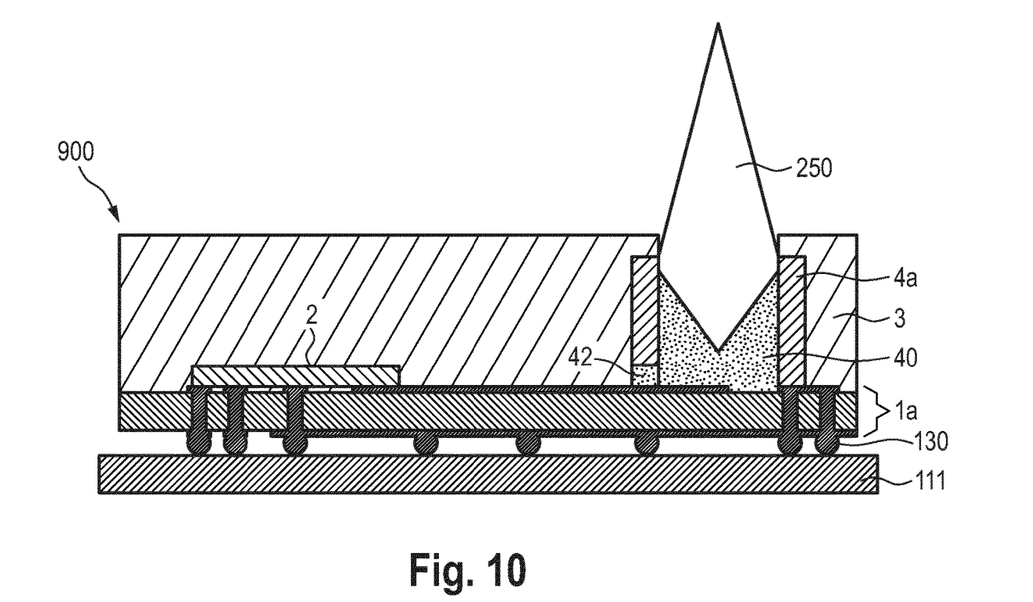
FIG. 10 shows a cross-sectional view of a ninth embodiment of a microwave antenna package according to the present disclosure.

Instead of placing a lid (i.e. an antenna frontend or cover layer 240) with a horn aperture on top of the waveguide as provided e.g. in the first and fourth embodiments, there may be also other ways of shaping the beam of the antenna. For example a dielectric rod antenna can be constructed by inserting a dielectric wedge into a rectangular waveguide 4a as shown in the ninth embodiment of the microwave antenna package 900, which is substantially identical to the second embodiment of the microwave antenna package 200 shown in FIG. 2 except for the cover layer 240 which is replaced by the dielectric rod 250. The dielectric rod 250 is inserted into the filling material 40 by pressing it into the top opening of the waveguide 4a and thus compresses the filling material 40 and is held with the waveguide 4a. For better matching the dielectric rod 250 may also have a wedge shape inside the waveguide.

Generally, the waveguide needs not to be rectangular, but can also have another cross-section, e.g. a circular cross-section, and the dielectric rod (or wedge) may also have another shape, such as a conical shape. Further, the same idea may also be used in other embodiments, e.g. in the fifth embodiment where the radiation is emitted to the bottom side rather than to the top side.

Figure 11:
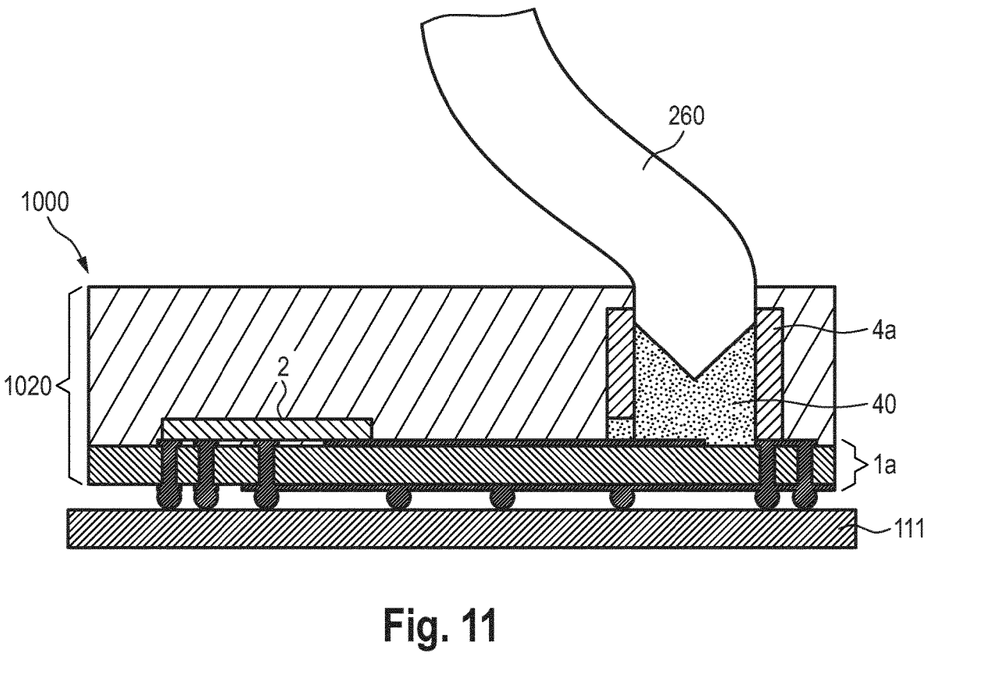
FIG. 11 shows a cross-sectional view of a tenth embodiment of a microwave antenna package according to the present disclosure.

The microstrip to waveguide transition in the eWLB package may also be used for a guided transmission. Therefore a (e.g. rectangular) dielectric waveguide 260 with a metal coating may be inserted into the waveguide 4a mounted inside the microwave antenna apparatus 1020 as shown in FIG. 11 showing a tenth embodiment of a microwave antenna package 1000 including the microwave antenna apparatus 1020, which is substantially identical to the second embodiment of the microwave antenna package 200 shown in FIG. 2 except for the cover layer 240 which is replaced by the dielectric waveguide 260. The dielectric waveguide 260 may be flexible in order to couple to another antenna, e.g. a horn antenna, arranged at a distance from the microwave antenna package 1000.

Figure 12A:
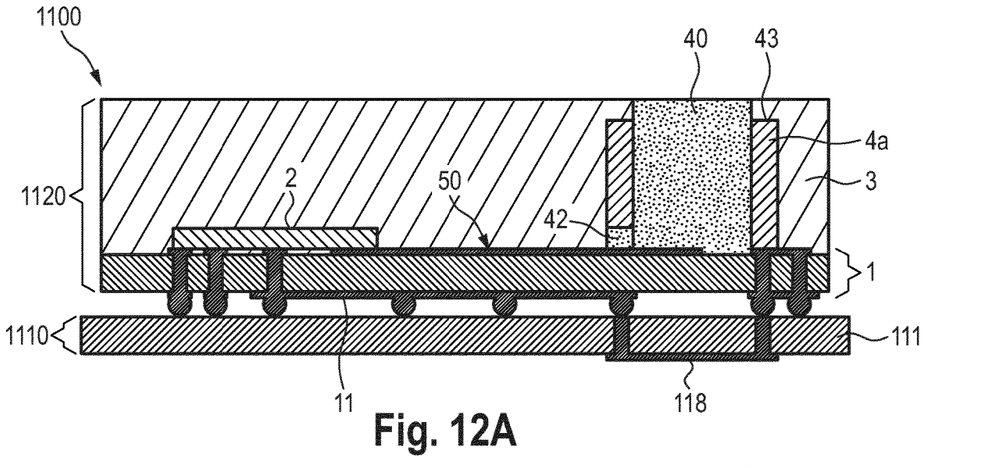
FIG. 12 shows a cross-sectional view of an eleventh embodiment of a microwave antenna package according to the present disclosure and a top view of a bow-tie antenna used therein.
Figure 12B:
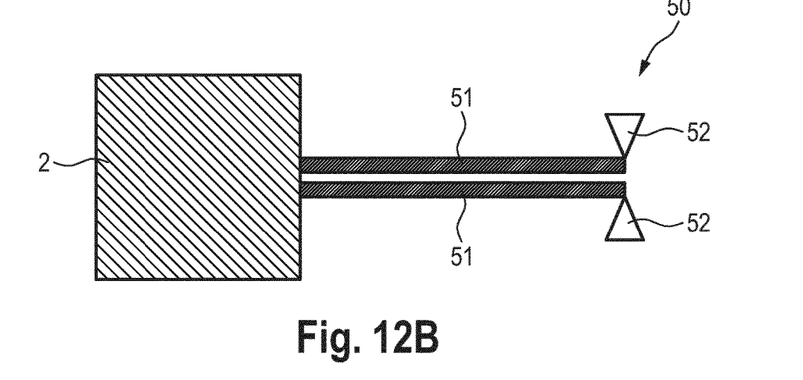

FIG. 12 shows a cross-sectional view (FIG. 12A) of an eleventh embodiment of a microwave antenna package 1100 according to the present disclosure and a top view (FIG. 12B) of a bow-tie antenna apparatus 50 used therein. The microwave antenna package 1100 comprises a microwave antenna apparatus 1120 and a PCB arrangement 1110.

The microwave antenna apparatus 1120 is substantially identical to the second embodiment of the microwave antenna apparatus 220 shown in FIG. 2, but instead of the microstrip line 13 a bow-tie antenna apparatus 50 is used. Thus, this embodiment employs another possibility to feed the antenna by use of a dipole like antenna. Sometimes differential signals are provided at the output ports of mm-wave MMICs. The differential ports can be directly connected to a grounded coplanar waveguide. The symmetrical structure of the grounded coplanar waveguide is perfectly suited to feed symmetrical dipole like antennas. For this purpose, a differential line 51 is used for connecting the with a bow-tie antenna element 52, which is provided at the end of the differential line 51 inside the waveguide 4a. The PCB arrangement 1110 comprises the PCB layer 111, which, in the area underneath the waveguide 4a, comprises a backshort 118 a quarter wavelength from the feed point. Due to the backshort 118 a standing wave is formed and all the energy is radiated to the top side.

Figure 13:
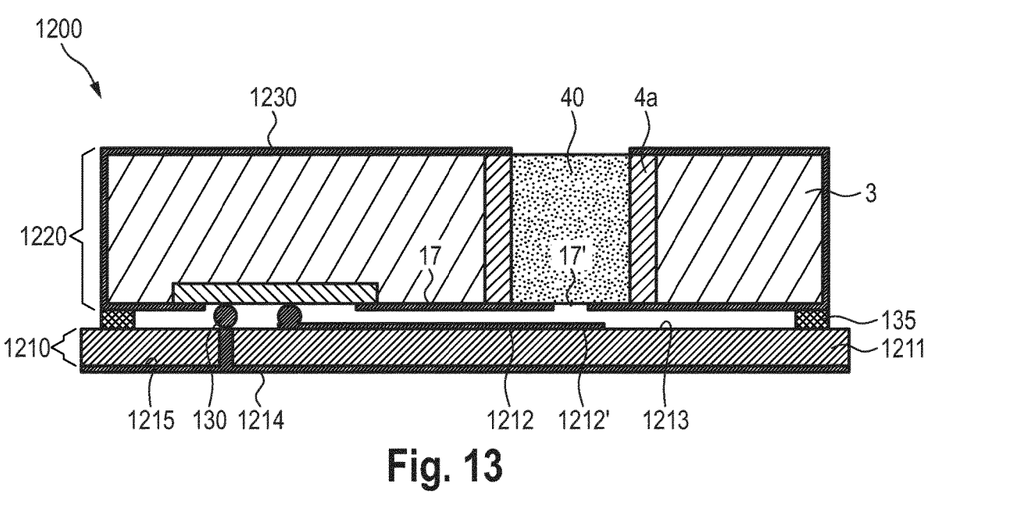
FIG. 13 shows a cross-sectional view of a twelfth embodiment of a microwave antenna package according to the present disclosure.

FIG. 13 shows a cross-sectional view of a twelfth embodiment of a microwave antenna package 1200 including a twelfth embodiment of a microwave antenna apparatus 1220 according to the present disclosure and a PCB arrangement 1210. According to this embodiment the semiconductor element 2 and a metal layer 17 are integrated in one eWLB package without connecting them on the package level as in the above described embodiments.

The PCB arrangement 1210 comprising the PCB layer 1211 and carries a microstrip line 1212 on a first surface 1213 and a ground plane 1214 on a second surface 1215 opposite the first surface 1213. The microwave antenna apparatus 1220 comprises a mold layer 3 carries the metal layer 17 arranged on a first surface 18 facing the first surface of the PCB arrangement 1210. The semiconductor element 2 is mounted on the metal layer 17. The waveguide 4a is arranged within the mold layer 3 and on the metal layer 17 and is coupled to the semiconductor element 2 by the metal layer 17.

Thus, the microstrip line 1212 on the PCB layer 1211 provides a transition between the MMIC 2 and the antenna feed 1212' underneath a slot 17' in the metal layer 17. Therefore, only a redistribution layer with one metal plate is required. The distance between the microwave antenna apparatus 1220 and the PCB arrangement 1210 is preferably well defined by additional spacers 135. The entire microwave antenna apparatus 1220 is preferably shielded by a shielding 1230 to avoid unwanted radiation. The metallization is preferably sputtered on top of the mold mass. The shielding technique can be applied to all other concepts as well.

Figure 14:
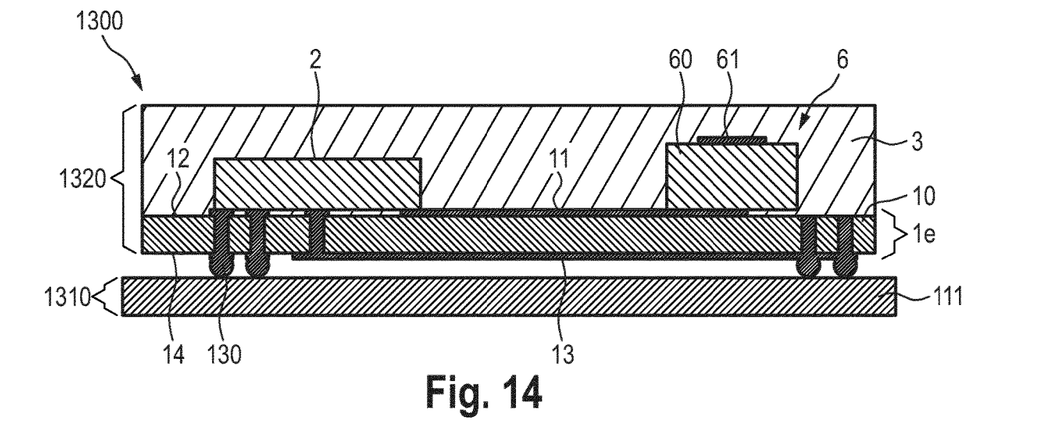
FIG. 14 shows a cross-sectional view of a thirteenth embodiment of a microwave antenna package according to the present disclosure.

FIG. 14 shows a cross-sectional view of a thirteenth embodiment of a microwave antenna package 1300 according to the present disclosure including a thirteenth embodiment of a microwave antenna apparatus 1320 and a PCB arrangement 1310 which substantially comprises a PCB layer 111. The microwave antenna apparatus 1320 includes a redistribution layer 1e, similar to the redistribution layer 1a, comprising a carrier layer 10, a microstrip line 11 arranged on a first surface 12 of the carrier layer 11 and a ground plane 13 arranged on second surface 14 of the carrier layer 10 opposite the first surface 12. The semiconductor element 2 is mounted on the first surface 12 of the carrier layer 10 and coupled to the ground plane 13 and the microstrip line 11. Also in this embodiment a mold layer 3 covers the semiconductor element 2 and the first surface 12 of the carrier layer 10.

Further, rather than a waveguide a resonator unit 6 is arranged within the mold layer 3 and on the first surface 12 of the carrier layer 10. The resonator unit 6 comprises a substrate element 60, in particular made of quartz glass, PTFE, LCP or ceramic, coupled to the microstrip line 11 and a resonator element 61 mounted on a surface of the substrate element 60 facing away from the first surface 12 of the carrier layer 10.

Thus, in an implementation of this embodiment a parasitic resonator is positioned directly above the feed line (microstrip line) or the antenna patch element 11. A small quartz glass substrate 61 is placed directly on top of the patch feed line or the patch antenna element 11. On top of the quartz glass 60, metallization for the parasitic resonator 61 is realized using thin film technology (and a galvanic process). By use of the parasitic resonator 61, radiation can be electromagnetically coupled to the resonator, leading to directive radiation to the top side with higher efficiency. The quartz glass substrate 60 together with the parasitic resonator 61 can be easily placed using a pick-and-place machine. Placement of multiple resonators is also possible for an antenna array. The height of the mold mass of the mold layer 3 above the parasitic resonator 62 can be adjusted based on the required antenna characteristics.

Figure 15:
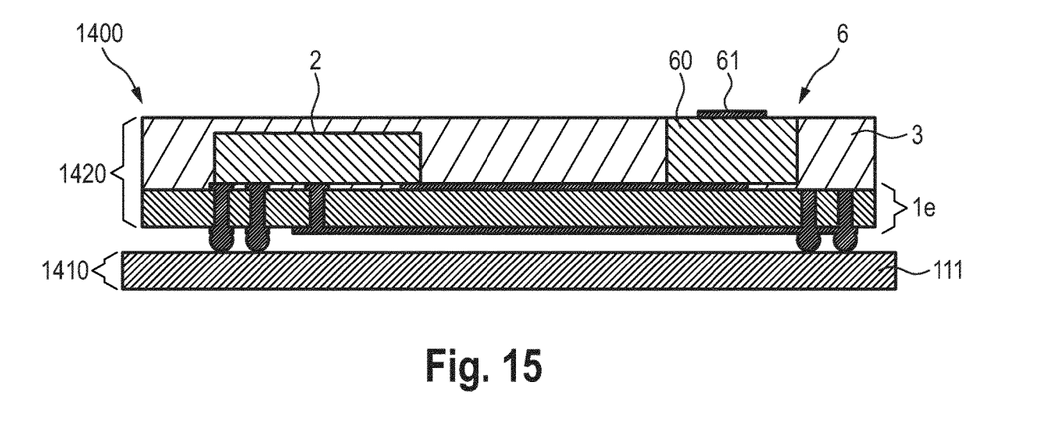
FIG. 15 shows a cross-sectional view of a fourteenth embodiment of a microwave antenna package according to the present disclosure.

FIG. 15 shows a cross-sectional view of a fourteenth embodiment of a microwave antenna package 1400 according to the present disclosure including a fourteenth embodiment of a microwave antenna apparatus 1420 and a PCB arrangement 1410 which is identical to the PCB arrangement 1310. In this embodiment the semiconductor element 2 and the quartz glass substrate 60 are placed on a carrier using a pick-and-place machine. After the mold mass 3 is thinned up to the quartz glass level, thin film technology is applied to place the parasitic resonator 61 on top of the quartz glass substrate 60.

Figure 16:
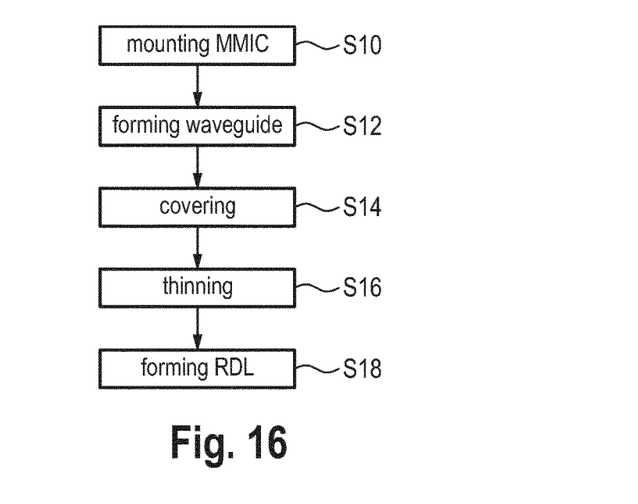
FIG. 16 shows a flow chart of a method according to the present disclosure.

FIG. 16 illustrates a flow chart of a method of manufacturing a microwave antenna apparatus according to the present disclosure as e.g. described in FIG. 9. This method comprises the steps of mounting (S10) a semiconductor element on a dummy carrier, arranging (S12) (forming or placing) a waveguide on the dummy carrier, wherein the waveguide is open on a side opposite to the side on which it is arranged on the dummy carrier, wherein a solid state filling material is arranged within the inner volume of the waveguide and beyond the opening on the open side of the waveguide, covering (S14) the semiconductor element, the waveguide including the solid state filling material and the dummy carrier layer by a mold layer, thinning (S16) the mold layer to an extent that the mold layer is thicker than the height of the waveguide, replacing (S18) the dummy carrier (i.e. removing the dummy carrier) by a redistribution layer, e.g. using thin-film technology, comprising a carrier layer, a ground plane arranged on a first or second surface of the carrier layer and a microstrip line arranged on the other one of the first or second surface of the carrier layer, so that the semiconductor element (2) is arranged on first surface of the carrier layer and coupled to the ground plane and the microstrip line and that the waveguide is arranged on the first surface of the carrier layer and coupled to the semiconductor element by the microstrip line.

Finally, for forming a microwave antenna package solder balls are placed on the bottom side of the carrier layer and the microwave antenna apparatuses are singulated. Further, the microwave antenna apparatus is mounted to the PCB layer by soldering to obtain the microwave antenna package.

The main advantages of the disclosure, compared to state of the art, are that a complete mm-wave wireless system integration in a SMT package can be achieved. Further, there is no need for external antennas, a wideband antenna response can be obtained, and coupling to a guided transmission is possible, e.g. by a dielectric waveguide.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

It follows a list of further embodiments of the disclosed subject matter:

1. Microwave antenna apparatus comprising:
    a redistribution layer comprising a carrier layer, a ground plane arranged on a first or second surface of the carrier layer and a microstrip line arranged on the other one of the first or second surface of the carrier layer,
    a semiconductor element mounted on the first surface of the carrier layer and coupled to the ground plane and the microstrip line,
    a mold layer covering the semiconductor element and the first surface of the carrier layer, and
    a waveguide arranged within the mold layer and on the first surface of the carrier layer and coupled to the semiconductor element by the microstrip line, wherein a solid state filling material is arranged within the waveguide.

2. Microwave antenna apparatus as defined in embodiment 1, wherein the filling material is a foam-like filling material having a permittivity below 1.5.

3. Microwave antenna apparatus as defined in any preceding embodiment, wherein the filling material comprises one or more of PCB material, mold material of the mold layer, material of the carrier, PTFE, PEN, PET, acryl.

4. Microwave antenna apparatus as defined in any preceding embodiment, wherein the waveguide is open or closed on a side opposite to the side on which it is arranged on the first surface of the carrier layer.

5. Microwave antenna apparatus as defined in any preceding embodiment, wherein the microstrip line is arranged on the first surface of the carrier layer and the ground plane is arranged on the second surface of the carrier layer and wherein the waveguide comprises an opening on a side adjacent the first surface of the carrier layer, through which the microstrip line leads into the waveguide.

6. Microwave antenna apparatus as defined in any preceding embodiment, wherein the waveguide is open on a side opposite to the side on which it is arranged on the first surface of the carrier layer and wherein the microwave antenna apparatus further comprises a cover layer arranged on top of the mold layer, the cover layer comprising an antenna frontend adjacent to the open side of the waveguide.

7. Microwave antenna apparatus as defined in any preceding embodiment, wherein said redistribution layer comprises two or more carrier layers and one or more metal layers, wherein the ground plane is arranged between adjacent carrier layers, the microstrip line is arranged on a second outer surface of the redistribution layer opposite the first outer surface, on which the waveguide is arranged, and a metal layer is arranged on the first outer surface of the redistribution layer, wherein the ground plane, the microstrip line and the one or more metal layers are configured to form an aperture coupled patch feed adjacent to the waveguide.

8. Microwave antenna apparatus as defined in any preceding embodiment, wherein the waveguide is open on a side opposite to the side on which it is arranged on the first surface of the carrier layer and wherein the filling material extends beyond the opening on the open side of the waveguide.

9. Microwave antenna apparatus as defined in any preceding embodiment, wherein the waveguide is open on a side opposite to the side on which it is arranged on the first surface of the carrier layer and wherein a rod antenna or additional waveguide is inserted into the opening on the open side of the waveguide.

10. Microwave antenna apparatus as defined in any preceding embodiment, wherein redistribution layer comprises two microstrip lines forming a differential line and a dipole antenna or bow-tie antenna arranged at the end of the differential line adjacent the waveguide.

11. Microwave antenna apparatus as defined in any preceding embodiment, further comprising a shielding provided at least on the outer surface of the mold layer.

12. Microwave antenna apparatus comprising:
a redistribution layer comprising a carrier layer, a microstrip line arranged on a first surface of the carrier layer and a ground plane arranged on second surface of the carrier layer opposite the first surface,
a semiconductor element mounted on the first surface of the carrier layer and coupled to the ground plane and the microstrip line,
a mold layer covering the semiconductor element and the first surface of the carrier layer, and
a resonator unit arranged within the mold layer and on the first surface of the carrier layer, wherein the resonator unit comprises a substrate element, in particular made of quartz glass, PTFE, LCP or ceramic, coupled to the microstrip line and a resonator element mounted on a surface of the substrate element facing away from the first surface of the carrier layer.

13. Microwave antenna package comprising
a PCB arrangement comprising a PCB layer and
a microwave antenna apparatus as defined in embodiment 1 or 12 coupled to the PCB arrangement forming an embedded wafer-level ball grid array.

14. Microwave antenna package as defined in embodiment 13,
wherein the microwave antenna apparatus is configured as defined in embodiment 1,
wherein the waveguide is closed on a side opposite to the side on which it is arranged on the first surface of the carrier layer and
wherein the PCB layer carries at least one contact layer on one surface, the contact layer being coupled to the semiconductor element via the coupling between the PCB arrangement and the microwave antenna apparatus, wherein a transmission area of the PCB layer facing the waveguide is free from the contact layer.

15. Microwave antenna package comprising
a PCB arrangement comprising a PCB layer carrying a first contact layer on a first surface and a second contact layer on a second surface opposite the first surface, wherein said contact layers are coupled by coupling elements arranged within the PCB layer, wherein a transmission area of the PCB layer is arranged between coupling elements and is free from the contact layer, and
a microwave antenna apparatus coupled to the PCB arrangement forming an embedded wafer-level ball grid array, said microwave antenna element comprising
a redistribution layer comprising a carrier layer, a ground plane arranged on a first or second surface of the carrier layer and a microstrip line arranged on the other one of the first or second surface of the carrier layer,
a semiconductor element mounted on the first surface of the carrier layer and coupled to the ground plane and the microstrip line,
a mold layer covering the semiconductor element and the first surface of the carrier layer.

16. Microwave antenna package as defined in embodiment 15,
wherein the redistribution layer comprises two or more carrier layers and one or more metal layers, wherein the ground plane is arranged between adjacent carrier layers, the microstrip line is arranged on a second outer surface of the redistribution layer opposite the first outer surface facing the PCB arrangement and a metal layer is arranged on the first outer surface of the redistribution layer, wherein the ground plane, the microstrip line and the one or more metal layers are configured to form an aperture coupled patch feed adjacent to the transmission area.

17. Microwave antenna package as defined in embodiment 15 or 16,
wherein the redistribution layer comprises two microstrip lines forming a differential line and a dipole antenna arranged at the end of the differential line adjacent the transmission area.

18. Microwave antenna package as defined in any one of embodiments 14 to 17,
further comprising a cover layer arranged on a surface of the PCB layer opposite the microwave antenna apparatus, the cover layer comprising an antenna frontend adjacent to the transmission area of the PCB layer.

19. Microwave antenna package as defined in any one of embodiments 13 to 18,
further comprising one or more spacers between the PCB arrangement and the microwave antenna apparatus.

20. Microwave antenna package comprising
a PCB arrangement comprising a PCB layer carrying a microstrip line on a first surface and a ground plane on a second surface opposite the first surface,
a microwave antenna apparatus coupled to the PCB arrangement forming an embedded wafer-level ball grid array, said microwave antenna element comprising
a mold layer carrying a metal layer arranged on a first surface facing the first surface of the PCB arrangement,
a semiconductor element mounted on the metal layer, and
a waveguide arranged within the mold layer and on the metal layer and coupled to the semiconductor element by the metal layer, wherein a solid state filling material is arranged within the waveguide.

21. Method of manufacturing a microwave antenna apparatus as defined in embodiment 8 comprising:
mounting (S10) a semiconductor element on a dummy carrier,
arranging (S12) a waveguide on the dummy carrier, wherein the waveguide is open on a side opposite to the side on which it is arranged on the dummy carrier, wherein a solid state filling material is arranged within the inner volume of the waveguide and beyond the opening on the open side of the waveguide,
covering (S14) the semiconductor element, the waveguide including the solid state filling material and the dummy carrier layer by a mold layer,
thinning (S16) the mold layer to an extent that the mold layer is thicker than the height of the waveguide,
replacing (S18) the dummy carrier by a redistribution layer, e.g. using thin-film technology, comprising a carrier layer, a ground plane arranged on a first or second surface of the carrier layer and a microstrip line arranged on the other one of the first or second surface of the carrier layer.

22. Method as defined in embodiment 21,
wherein said filling material comprises two filling material areas, wherein one filling material has a detectable feature, which enables distinguishing the two filling material areas, wherein the first filling material area fills the waveguide and extends beyond the opening on the open side of the waveguide to the extent corresponding to the desired thickness of the mold layer,
wherein during said thinning a detection is performed to detect the border between the first filling area and the second filling area by detecting the detectable feature and the thinning is stopped upon detection of said border.

23. Method as defined in embodiment 21 or 22,
wherein the detectable feature is an optically detectable feature.

24. Method as defined in embodiment 21, 22 or 23,
wherein the first filling material area has a different color than the second filling material area and wherein in the detection it is detected during thinning when the color changes.

The invention claimed is:

1. A microwave antenna apparatus comprising:
a redistribution layer comprising a carrier layer, a ground plane arranged on a first or second surface of the carrier layer, and a microstrip line arranged on the other one of the first or second surface of the carrier layer;
a semiconductor element mounted on the first surface of the carrier layer and coupled to the ground plane and the microstrip line;
a mold layer covering the semiconductor element and the first surface of the carrier layer; and
a waveguide arranged within the mold layer and on the first surface of the carrier layer and coupled to the semiconductor element by the microstrip line, wherein a solid state filling material is arranged within the waveguide.

2. A microwave antenna apparatus as claimed in claim 1, wherein the filling material is a foam-like filling material having a permittivity below 1.5.

3. A microwave antenna apparatus as claimed in claim 1, wherein the filling material comprises one or more of PCB material, mold material of the mold layer, material of the carrier, PTFE, PEN, PET, acryl.

4. A microwave antenna apparatus as claimed in claim 1, wherein the waveguide is open or closed on a side opposite to the side on which it is arranged on the first surface of the carrier layer.

5. A microwave antenna apparatus as claimed in claim 1, wherein the microstrip line is arranged on the first surface of the carrier layer and the ground plane is arranged on the second surface of the carrier layer, and
wherein the wave-guide comprises an opening on a side adjacent the first surface of the carrier layer, through which the microstrip line leads into the waveguide.

6. A microwave antenna apparatus as claimed in claim 1, wherein the waveguide is open on a side opposite to the side on which it is arranged on the first surface of the carrier layer, and
wherein the microwave antenna apparatus further comprises a cover layer arranged on top of the mold layer, the cover layer comprising an antenna frontend adjacent to the open side of the waveguide.

7. A microwave antenna apparatus as claimed in claim 1, wherein the redistribution layer comprises two or more carrier layers and one or more metal layers,
wherein the ground plane is arranged between adjacent carrier layers, the microstrip line is arranged on a second outer surface of the redistribution layer opposite the first outer surface, on which the waveguide is arranged, and a metal layer is arranged on the first outer surface of the redistribution layer,
wherein the ground plane, the microstrip line, and the one or more metal layers are configured to form an aperture coupled patch feed adjacent to the waveguide.

8. A microwave antenna apparatus as claimed in claim 1, wherein the waveguide is open on a side opposite to the side on which it is arranged on the first surface of the carrier layer, and
wherein the filling material extends beyond the opening on the open side of the waveguide.

9. A microwave antenna apparatus as claimed in claim 1, wherein the waveguide is open on a side opposite to the side on which it is arranged on the first surface of the carrier layer, and
wherein a rod antenna or additional waveguide is inserted into the opening on the open side of the waveguide.

10. A microwave antenna apparatus as claimed in claim 1, wherein redistribution layer comprises two microstrip lines forming a differential line and a dipole antenna or bow-tie antenna arranged at the end of the differential line adjacent the waveguide.

11. A microwave antenna apparatus comprising:
a redistribution layer comprising a carrier layer, a microstrip line arranged on a first surface of the carrier layer and a ground plane arranged on second surface of the carrier layer opposite the first surface;
a semiconductor element mounted on the first surface of the carrier layer and coupled to the ground plane and the microstrip line;
a mold layer covering the semiconductor element and the first surface of the carrier layer; and
a resonator unit arranged within the mold layer and on the first surface of the carrier layer, wherein the resonator unit comprises a substrate element, made of quartz glass, PTFE, LCP or ceramic, coupled to the microstrip line and a resonator element mounted on a surface of the substrate element facing away from the first surface of the carrier layer.

12. A microwave antenna package comprising:
a PCB arrangement comprising a PCB layer carrying a first contact layer on a first surface and a second contact layer on a second surface opposite the first surface, wherein said contact layers are coupled by coupling elements arranged within the PCB layer, wherein a transmission area of the PCB layer is arranged between coupling elements and is free from the contact layer; and
a microwave antenna apparatus coupled to the PCB arrangement forming an embedded wafer-level ball grid array, said microwave antenna element comprising:
a redistribution layer comprising a carrier layer, a ground plane arranged on a first or second surface of the carrier layer, and a microstrip line arranged on the other one of the first or second surface of the carrier layer;
a semiconductor element mounted on the first surface of the carrier layer and coupled to the ground plane and the microstrip line;
a mold layer covering the semiconductor element and the first surface of the carrier layer.

13. A microwave antenna package as claimed in claim 12, wherein the redistribution layer comprises two or more carrier layers and one or more metal layers,
wherein the ground plane is arranged between adjacent carrier layers, the microstrip line is arranged on a second outer surface of the redistribution layer opposite the first outer surface facing the PCB arrangement and a metal layer is arranged on the first outer surface of the redistribution layer,
wherein the ground plane, the microstrip line, and the one or more metal layers are configured to form an aperture coupled patch feed adjacent to the transmission area.

14. A microwave antenna package as claimed in claim 12, wherein the redistribution layer comprises two microstrip lines forming a differential line and a dipole antenna arranged at the end of the differential line adjacent the transmission area.

15. A microwave antenna package as claimed in claim 12, further comprising one or more spacers between the PCB arrangement and the microwave antenna apparatus.

* * * * *